United States Patent [19]
Kawahira

[11] Patent Number: 5,725,974
[45] Date of Patent: Mar. 10, 1998

[54] METHOD AND APPARATUS FOR PRODUCING SCANNING DATA USED TO PRODUCE A PHOTOMASK

[75] Inventor: Hiroichi Kawahira, Kanagawa, Japan

[73] Assignee: Sony Corporation, Tokyo, Japan

[21] Appl. No.: 672,916

[22] Filed: Jun. 28, 1996

[30] Foreign Application Priority Data

Jun. 30, 1995 [JP] Japan .................................. 7-188143

[51] Int. Cl.$^6$ .................................. G03F 9/00; G21K 5/00
[52] U.S. Cl. .................................. 430/5; 378/35
[58] Field of Search .................................. 430/5; 378/35

[56] References Cited

U.S. PATENT DOCUMENTS 5,202,204   4/1993   Kawahira et al. .......................... 430/5
5,308,991   5/1994   Kaplan ........................................ 430/5

*Primary Examiner*—Mark Chapman
*Attorney, Agent, or Firm*—Hill, Steadman & Simpson

[57] ABSTRACT

The invention provides a method for generating scanning data used to control a photomask production system for producing a photomask for use in semiconductor production so as to produce a photomask having a pattern corrected in terms of the optical proximity effects wherein it is possible to perform data processing and data conversion associated with the correction in terms of the optical proximity effects without introducing significant rounding errors, and it is possible to make correction in terms of the optical proximity effects without increasing the time required to produce the photomask, and furthermore it is possible to easily deal with a change in the process condition such as the resist exposure condition.

In the method for generating scanning data used to control the pattern exposing operation of a pattern exposure apparatus of the raster scanning type or of the vector scanning type so as to form a pattern on a photomask, wherein the pattern formed according to the above scanning data is corrected so that when a pattern is formed in a resist by exposing the resist to exposure light via the above-described pattern formed on the photomask, the deformation of the resultant pattern formed in the resist is minimized, the scanning data is generated by the process including the steps of: generating scanning data on the basis of mask data received from the outside; and correcting the scanning data produced in the previous step according to a predefined correction method thereby generating the corrected scanning data.

11 Claims, 4 Drawing Sheets

METHOD AND APPARATUS FOR PRODUCING SCANNING DATA USED TO PRODUCE A PHOTOMASK

BACKGROUND OF THE INVENTION

1. Field of the Invention

The present invention relates to a method and apparatus for generating scanning data used to produce a photomask for use in semiconductor production, and more particularly, to a method and apparatus for generating scanning data used to control the pattern writing operation of a pattern exposure apparatus of the raster scanning type or of the vector scanning type installed in a photomask production system for producing a photomask having a pattern corrected in terms of the optical proximity effects.

2. Description of the Related Art

In lithography process of semiconductor device production, a resist is coated on a wafer and then exposed to light via a photomask having a pattern formed on a surface of the photomask. The resist is then developed. Thus a pattern corresponding to the pattern on the photomask is formed in the resist. Hereinafter, the pattern formed on the photomask will also be referred to as a mask pattern, and the pattern transferred to the resist will also be referred to as a resist pattern. In the process of transferring a mask pattern to a resist pattern, optical proximity effects can occur in the range near the resolution limit. The optical proximity effects cause a deviation (difference) in the size or the shape of the transferred resist pattern from the ideal size or the shape of a design pattern implemented as a mask pattern. In the case of the 0.5 µm or greater design rule, the lithography process in semiconductor production processes allows a rather large dimensional tolerance, the above-described deviation does not result in a serious problem. However, in the 0.35 µm or less design rule, the lithography process in semiconductor production processes allows a very small dimensional tolerance, and thus the deviation can produce a significant problem.

One know technique to obtain a finer mask pattern with less optical proximity effect is to employ a phase-shifting mask (hereafter referred to as a phase-shifting mask technique). Another technique is to employ deformation illumination such as oblique illumination (hereafter referred to as a deformation illumination technique). It is said that these known techniques can reduce the optical proximity effect thereby improving the pattern transfer characteristics in the range near the resolution limit. In practice, however, in the phase-shifting mask technique in which the phase of the exposure light is controlled and also in the deformation illumination technique in which the order of diffraction of the exposure light is controlled, another optical proximity effect occurs due to a second order peak of the light. In the case where a phase-shifting mask is used, the additional optical proximity effect described above can produce an undesired pattern in a resist area other than a desired pattern area. On the other hand, when the deformation illumination technique is employed, although a high-resolution line-and-space pattern can be formed in a resist in a central area, significant degradation in resolution occurs in a peripheral area.

As described above, in 0.35 µm or less design rules, the optical proximity effects can produce a significant deviation of a resist pattern from a mask pattern not only when pattern transfer process is performed with a common photomask using a common exposure technique, but even when the phase-shifting mask technique or the deformation illumination technique is employed. To overcome the above problems, techniques of correcting a mask pattern in terms of the optical proximity effects are now receiving much attention. The major aspects to be considered in the optical proximity effects are as follows:

1. Line width correction

Figure 4A:
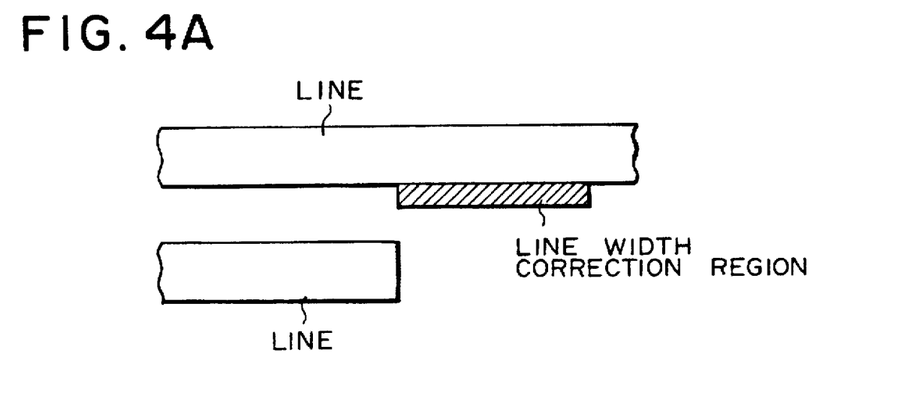
FIG. 4 is a schematic representation of various techniques of making correction in terms of the optical proximity effects.

The line width of an isolated line of a mask pattern is increased so that after transferring the mask pattern to a resist pattern via an exposure process, the line width of the isolated line formed in the resist becomes equal to the width of the corresponding line-and-space pattern (refer to FIG. 4A, in which the shaded area denotes a line width correction area).

2. Addition of modification patterns

Figure 4B:
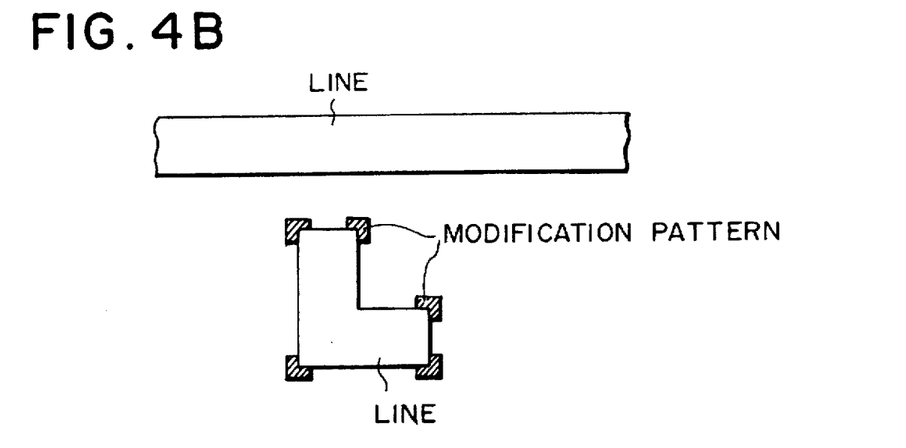

Modification patterns are added to the original mask pattern, for example, at locations adjacent to edge portions of contact holes so as to prevent the edge portions of contact holes from being deformed into a round shape in the exposed resist pattern (refer to FIG. 4B, in which the shaded areas represent modification patterns).

3. Addition of sub-resolution patterns

Figure 4C:
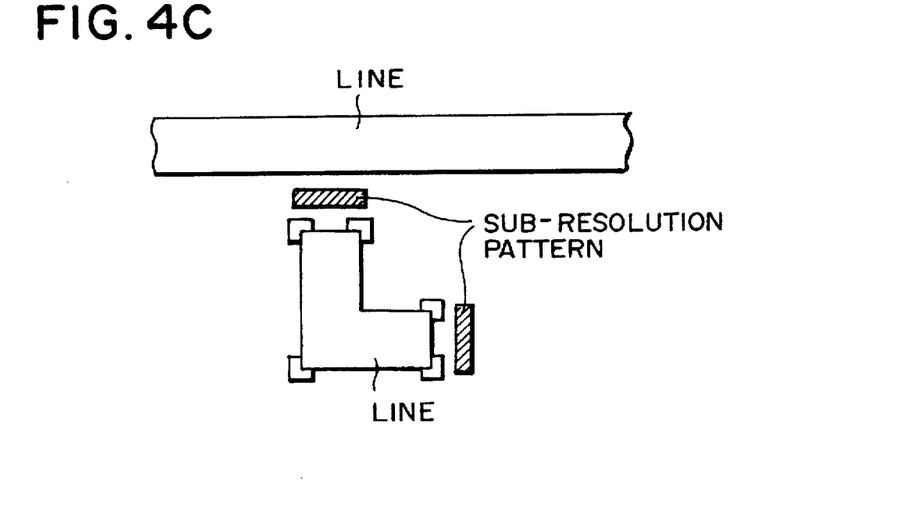

In the case where the modification patterns described above are not effective to correct for the optical proximity effects, patterns with a size small enough not to be resolved are further added to the mask pattern (refer to FIG. 4C, in which the shaded areas represent sub-resolution patterns).

Various techniques are known in the art to determine a mask pattern corrected for the optical proximity effects in terms of the above-described aspects. One of such techniques is the correction method based on the photolithography simulation disclosed for example in "Automated Determination of CAD Layout Failures Through Focus: Experiment and Simulation," C. Spence et el., SPIE, Vol. 2197 (1994), pp302–313, in which the photolithography process simulation is performed repeatedly until the mask pattern is optimized. Another technique is the rules-based correction method, disclosed for example in "Correcting for proximity effect widens process latitude," R. Henderson et al., SPIE, Vol. 2197 (1994), pp361–370 or "Automated optical proximity correction—a rules-based approach," O. Otto et al., SPIE, Vol. 2197 (1994), pp.278–293, in which a mask pattern is determined on the basis of correction values which have been given in response to various patterns according to the predefined rules. In the technique called the function-based correction technique, disclosed for example in "Using behavior modelling for proximity correction", M. Rieger, et al., SPIE, Vol. 2197 (1994), pp.371–375 or "Fast proximity correction with zone sampling", J. Stirniman et al., SPIE, Vol. 2197 (1994), pp.294–301, a mask pattern is corrected on the basis of the function representing the relationship between the mask pattern and the resist pattern.

Figure 3:
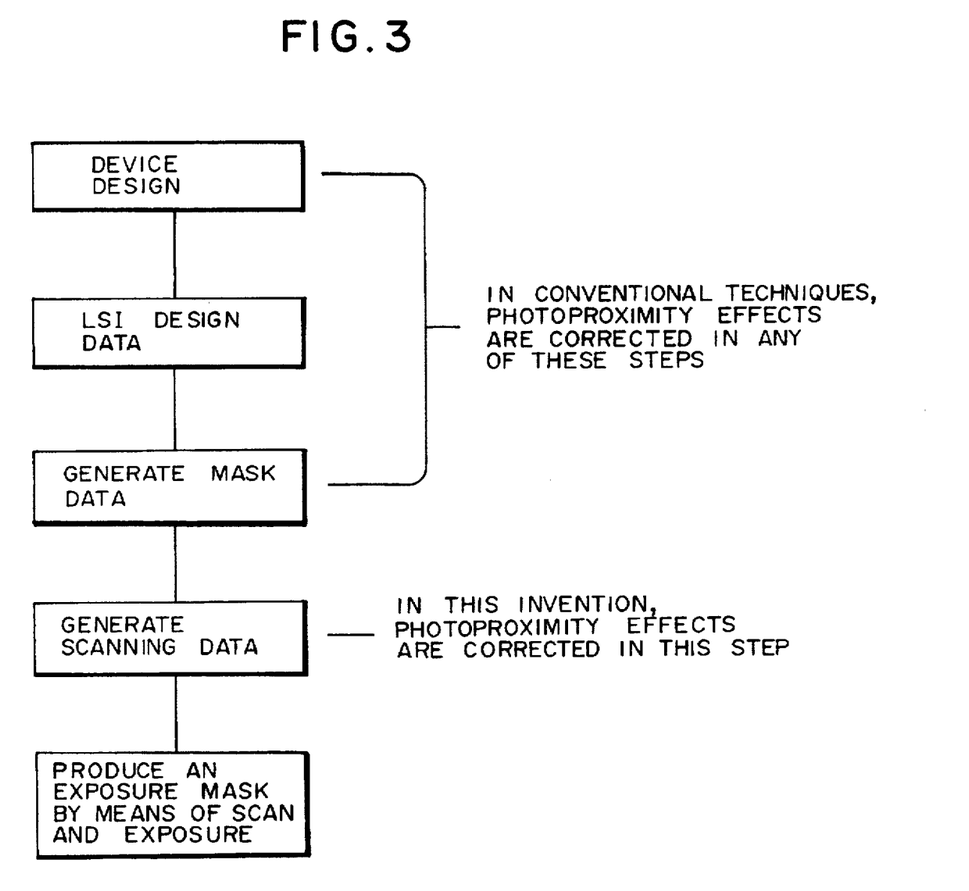
FIG. 3 is a flow chart illustrating the procedure of generating scanning data according to the present invention and also illustrating the procedure according to a conventional technique.

In a conventional technique of producing a photomask, as shown in the flow chart of FIG. 3, after completion of device design (cell design), LSI design data is generated on the basis of the device design. Furthermore, mask data to be used to produce a mask pattern is generated on the basis of the LSI design data. The mask pattern is then written onto a resist material coated on a photomask in accordance with the above mask data by means of the electron beam exposure technique or the laser beam exposure technique using a photomask production system including a pattern exposure apparatus of the raster scanning type or of the vector scanning type. In the conventional process, the correction for the optical proximity effects is performed when the mask data is produced. In some cases, after performing device design once, the correction for the optical proximity effects is performed by modifying the device design, or after generating LSI design data once, optical proximity effect correction is performed by modifying the LSI design data. In the above process, data processing for the optical proximity effect correction is performed using a personal computer, engineering work station, or medium or large scale computer.

In the convention process, as described above, correction for the optical proximity effects is performed after performing device design or after generating LSI design data or otherwise during the process of generating mask data. However, the optical proximity effect correction requires data processing including a great number of calculation steps and thus requires a very long processing time. Therefore, it is very difficult to complete the optical proximity effect correction within an allowable time during the processes from the LSI design to the production of a photomask. In particular, in the case of ASICs (application specific integrated circuits), a great number of components are required to be integrated on a single chip, and thus a very long processing time is required to perform optical proximity effect correction. For example, as long as a few ten days or longer processing time is required to perform a calculation of optical proximity effect correction for one layer of an ASIC, which will have a chip size of 20 mm×20 mm when implemented on an actual wafer (in accordance with a 0.25 μm design rule), by means of the correction method based on the photolithography simulation using a 135-MIPS engineering work station. Therefore, in practice, it is difficult to perform correction for the optical proximity effects for ASICs in which it is generally required to perform a sequence of processes from generation of mask data to production of a photomask within a very short time. The exposure process time required for a typical photomask is about 2 hours. Therefore, if it is possible to perform data processing associated with the optical proximity effect correction within 2 hours, or more generally within a time period less than the exposure process time of a photomask, then correction for the optical proximity effects can be made without a significant increase in turn around time.

On the other hand, if the optical proximity effect correction is performed at a stage earlier than the photomask exposure process, then a rounding error occurs during data processing such as a correction calculation or data conversion. The above rounding error can produce an error in a mask pattern obtained after a photomask exposure process, which results in a failure to properly compensate for the optical proximity effects.

Furthermore, data processing associated with the optical proximity effect correction has to be performed each time the light source of an exposure apparatus is changed, the resist employed is changed, or the resist exposure conditions are changed. Therefore, such the data processing operation requires a great number of process steps and thus a great length of time. Furthermore, when a reduced design rule is employed, although it is possible to reduce the mask data itself, it is required to perform again data processing associated with the optical proximity effect correction.

In view of the above, it is an object of the present invention to provide a method and apparatus for generating scanning data used to control a photomask production system for producing a photomask for use in semiconductor production so as to produce a photomask having a pattern corrected in terms of the optical proximity effects wherein it is possible to perform data processing and data conversion associated with the correction in terms of the optical proximity effects without introducing significant rounding errors, and it is possible to make correction in terms of the optical proximity effects without increasing the time required to produce the photomask, and furthermore it is possible to easily deal with a change in the process condition such as the resist exposure condition.

SUMMARY OF THE INVENTION

To achieve the above object, the present invention provides a scanning data generation apparatus which is a part of a photomask production system including a pattern exposure apparatus of the raster scanning type or of the vector scanning type and which generates scanning data used to control the pattern exposing operation of the pattern exposure apparatus so as to form a pattern on a photomask, wherein the pattern formed according to the above scanning data is corrected so that when a pattern is formed in a resist by exposing the resist to exposure light via the above-described pattern formed on the photomask, the deformation of the resultant pattern formed in the resist is minimized, the scanning data generation method including the steps of:

(1) scanning data generation means which receives mask data from the outside and generates scanning data on the basis of the received mask data;

(2) data storage means for storing the scanning data generated by the scanning data generation means;

(3) correction processing means for correcting the scanning data stored in the data storage means in accordance with a predefined correction method; and (4) output control means for transmitting the corrected scanning data to the pattern exposure apparatus. The deformation of the pattern which is formed in the resist by exposing the resist to the exposure light via the photomask pattern is mainly due to the optical proximity effects.

In the scanning data generation apparatus of the invention, the scanning data generation means and the correction processing means are preferably composed of a plurality of microprocessor units which operate in parallel so as to reduce the overall processing time. In this case, the scanning data generation means may be composed of a set of microprocessor units and the correction processing means may be composed of another set of microprocessor units, or otherwise both the scanning data generation means and the correction processing means may be composed of the same set of microprocessor units.

Furthermore, the present invention also provides a method of generating scanning data used to control the pattern exposing operation of a pattern exposure apparatus of the raster scanning type or of the vector scanning type so as to form a pattern on a photomask, wherein the pattern formed according to the above scanning data is corrected so that when a pattern is formed in a resist by exposing the resist to exposure light via the above-described pattern formed on the photomask, the deformation of the resultant pattern formed in the resist is minimized, the scanning data generation method including the steps of:

generating scanning data on the basis of mask data received from the outside; and correcting the scanning data produced in the previous step according to a predefined correction method thereby generating the corrected scanning data.

In the method of generating scanning data according to the present invention, the step of generating scanning data and the step of correcting the scanning data are preferably performed in a parallel processing fashion so as to reduce the overall processing time.

Furthermore, in the method of generating scanning data according to the present invention, a rule-based correction method, function-based correction method, or photolithography simulation correction method (also called light intensity distribution simulation correction method) may be employed as the predefined correction method described above.

In the method of generating scanning data according to the present invention, since scanning data is generated on the basis of mask data and subsequently the scanning data is corrected according to the predefined correction method, it is possible to correct the scanning data in terms of the optical proximity effects in a shorter time than required in the conventional technique. Thus, the present invention makes it possible to produce a photomask having a pattern corrected in terms of the optical proximity effects without significantly increasing the length of time required to produce the photomask. Furthermore, in the present invention, since the correction for the optical proximity effects is performed at the stage immediately prior to the mask pattern exposing process, rounding errors which occur during various data processing and data conversion can be minimized. Furthermore, even when the resist exposure condition or design rule is changed, it is possible to readily deal with such the change only by making correction in terms of the optical proximity effects on the basis of the mask data.

DESCRIPTION OF THE PREFERRED EMBODIMENTS

With reference to specific embodiments, the present invention will be described in greater detail below in connection with the accompanying drawings.

EMBODIMENT 1

In this first embodiment, the rule-base correction method is used to correct the scanning data generated in a previous processing step. First, a photomask production system employed in this specific embodiment is described with reference to FIG. 1.

Figure 1:
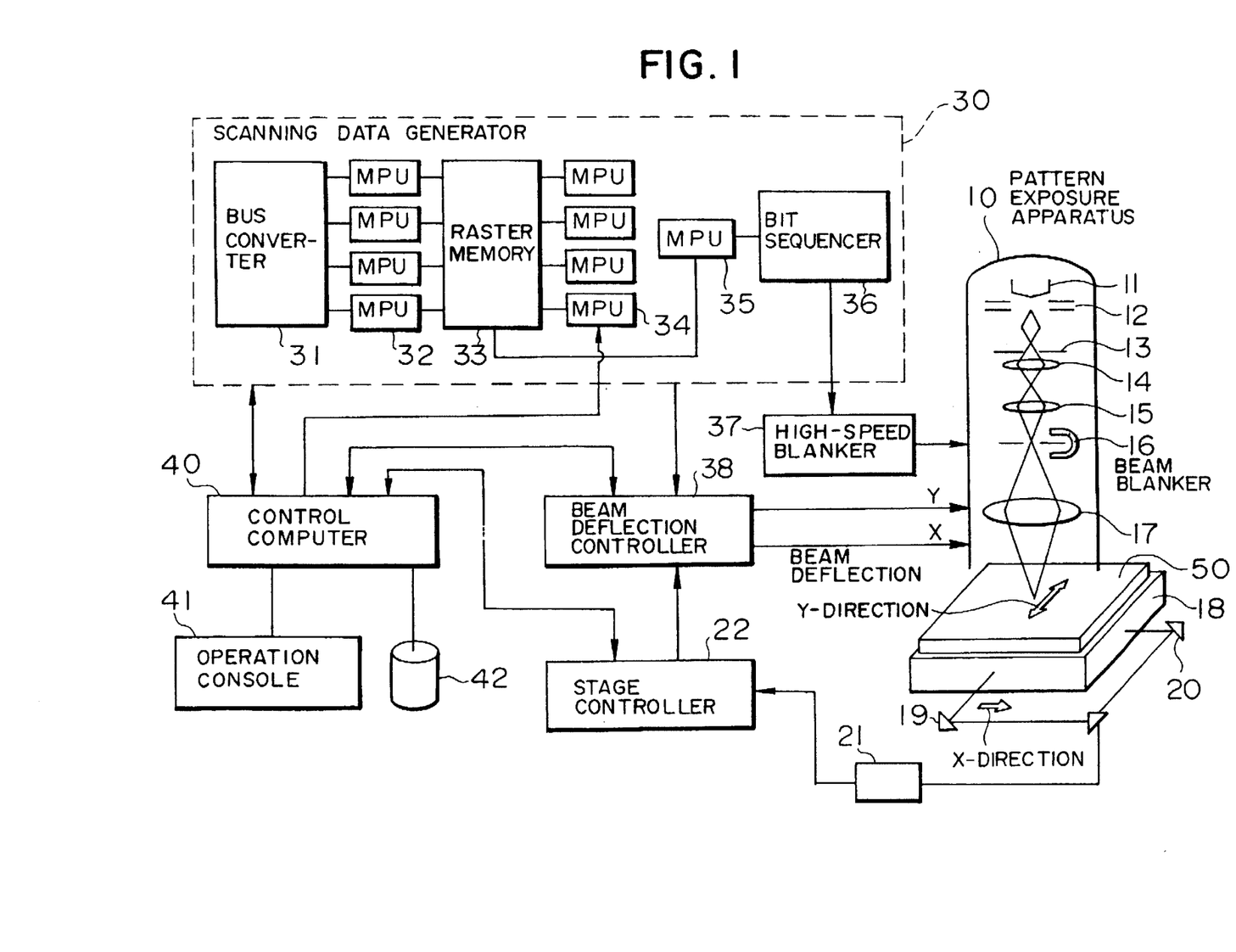
FIG. 1 is a schematic diagram partially in block form illustrating a first embodiment of a photomask production system according to the present invention.

In this embodiment, an electron beam pattern exposure apparatus MEBES4500 (available from Etec System Co.) of the type in which a photomask placed on a continuously-driven stage is raster-scanned by a gaussian beam is employed as a pattern exposure apparatus 10. The exposure operation was performed at a blanking frequency of 160 Mhz, at an acceleration voltage of 10 KV, and with an address size of 0.05 µm. A synthetic quartz chromium mask substrate EQZ6025 (available from HOYA Co.) was used as a photomask substrate. A 0.5 µm thick resist (positive electron beam resist EBR-9 available from TORAY Co.) was coated on the surface of the photomask substrate. The resist was exposed to the electron beam by an amount of 1.4 µC/cm$^2$. In this specific embodiment, the mask pattern to be formed on the photomask substrate was designed for a gate array ASCI including 2 million gates according to the 0.25 µm rule, in which a single device layer, that is, a polysilicon gate layer was employed. Furthermore the correction for the optical proximity effects was performed by adding modification patterns.

The pattern exposure apparatus 10 in the photomask production system includes an exposure beam source 11 for generating an electron beam, a zero-th lens 12, a limiting aperture 13, a first lens 14, a second lens 15, a beam blanker 16, and an objective lens 17. The pattern exposure apparatus 10 further includes: a stage 18 for carrying a photomask substrate 50 placed thereon; a laser interferometer 21; and a high-speed beam blanking unit (high-speed blanker) 37. The electron beam generated by the exposure beam source 11 travels passing through the zero-th lens 12, limiting aperture 13, first lens 14, second lens 15, beam blanker 16, and objective lens 17, and finally illuminates the photomask substrate 50 placed on the stage 18 so that a resist material (not shown) formed on the photomask substrate 50 is exposed.

The electron beam is scanned in ±Y directions under the control of a beam deflection controller 38. In response to the output signal of the high-speed beam blanking unit 37, the beam blanker 16 controls the operation of whether the electron beam illuminates the photomask substrate at desired coordinates. The stage 18 is moved in the X-direction by a stage driving mechanism (not shown) under the control of a stage controller 22. The location of the stage 18 is monitored by the laser interferometer 21 via a beam splitters 19 and 20.

The photomask production system also includes a control computer 40 responsible for the control of operations over the entire photomask production system. More specifically, starting, stopping, processing associated with the optical proximity effect correction, and other operations of the photomask production system are performed under the control of the control computer 40. The control computer 40 is connected to an operation console 41. Mask data and optical proximity effect correction parameters are produced previously and stored on a disk storage unit 42 connected to the control computer 40.

The photomask production system further includes a scanning data generator 30 which generates scanning data used to control the exposure scanning operation of the pattern exposure apparatus 10. The scanning data generator 30 consists of scanning data generation means 32, data storage means 33, correction processing means 34, and output control means 35. The scanning data generation means 32 receives mask data from the outside, and generates scanning data on the basis of the received mask data. The data storage means 33 stores the scanning data generated by the scanning data generation means 32. The correction processing means 34 modifies the scanning data stored in the data storage means 33 according to a predefined method (in this specific embodiment 1, the rule-based correction method) so as to compensate for the optical proximity effects. The output control means 35 is composed of a microprocessor unit (hereafter also referred to as an MPU). The output control means 35 transfers the corrected scanning data to the pattern exposure apparatus. In this embodiment 1, the scanning data generation means 32 and the correction processing means 34 are each composed of four microprocessor units (more specifically, 32-bit RISC chips which operate at a clock frequency of 135 Mhz) so that parallel processing may be performed by these microprocessor units. The term "parallel processing" is used here to represent both parallel processing and simultaneous processing. Although four microprocessor units are used in this specific embodiment, an arbitrary number of microprocessor units may be employed. Furthermore, the number of MPUs constituting the scanning data generation means 32 may be either equal to or different from the number of MPUs constituting the correction processing means 34.

The scanning data generator 30 further includes a bus converter 31 in front of the scanning data generation means 32 and also includes a bit sequencer 36 following the output control means 35.

When an operator desires to start an exposure operation, the operator issues a start command via the operation console 41 to the control computer 40. The control computer 40 sequentially reads mask data from the disk storage unit 42 according to proper timing, and sends the mask data to the scanning data generator 30. When it is desired to perform correction for the optical proximity effects on the generated scanning data, the operator issues a command via the operation console 41 when starting the exposure operation, to indicate that the optical proximity effect correction should be performed.

In the scanning data generator 30, the mask data is distributed, in the order of exposing, to four MPUs constituting the scanning data generation means 32 via the bus converter 31. On the basis of the mask data the scanning data generation means 32 generates scanning data in the form of bit-mapped raster data using a known technique. As described above, the scanning data generation means 32 receives mask data from the outside (more specifically, from the disk storage unit 42 via the control computer 40), and generates raster data to be used as scanning data from the received mask data.

In the conventional process, as shown in FIG. 3, correction for the optical proximity effects is performed at a stage after completion of device design, or after generation of LSI design data, or otherwise during a process of generating mask data. On the other hand, in the present invention, as shown also in FIG. 3, correction for the optical proximity effect is performed when scanning data is generated on the basis of the mask data.

The scanning data generated by the scanning data generation means 32 is stored sequentially into the data storage means 33 which consists of, in this specific embodiment 1, two random access memories each having a capacity of 256 Mbits serving as raster memories.

When the data storage means 33 is entirely filled with the scanning data, the scanning data generation means 32 stops generation of scanning data. The correction processing means 34 composed of four MPUs sequentially reads the scanning data from the data storage means 33. Then the correction processing means 34 selects, via the control computer 40, proper optical proximity effect correction parameters from the optical proximity effect correction parameters stored in the disk storage unit 42, and performs optical proximity effect correction for each of all the scanning data (bit-mapped raster data) according to the rule-based correction method. After completion of the optical proximity effect correction, the corrected scanning data is stored again in the data storage means 33.

A specific example of implementation of the rule-based correction method is a program OPRX developed by Trans Vector Technologies Co. (a USA company). In this rule-based correction method, various possible combinations of sub-patterns (hereafter also referred to as target patterns) of the mask pattern to be corrected in terms of the optical proximity effects and mask pattern layouts adjacent to the target patterns (hereafter such layouts will also be referred to as adjacent layouts) are considered. Some examples of possible combinations are shown in Table 1.

TABLE 1

| Target Pattern | Adjacent Layout |
| --- | --- |
| Singe line | Two lines with the same width as the target pattern, each located on each side of the target pattern via a space |
| Singe line | One line with the same width as the target pattern, located on a side of the target pattern via a space |
| Single line | One wide line located on a side of the target pattern via a space |
| Single line having | One line with the same width as the target an end pattern, wherein the line is located adjacent to the end of the target pattern and extends in a direction perpendicular to the single line of the target pattern. |

According to experiments or simulation, a modification pattern is defined for each of the assumed possible combinations of target patterns and adjacent layouts, and optical proximity effect correction parameters representing the defined modification patterns are stored in a table. That is, the table includes optical proximity effect correction parameters corresponding to various combinations of target patterns and adjacent layouts. The mask data is analyzed so as to evaluate the relationship between a target pattern of for example a 10 µm×10 µm square pattern and its adjacent layout. In response to the evaluation result, a proper optical proximity effect correction parameter is read from the table wherein the optical proximity effect correction parameter represents a corresponding modification pattern. In accordance with the optical proximity effect correction parameters obtained in the above-described manner, the correction processing means 34 performs optical proximity effect correction optimum for each of all scanning data (in a bit-mapped form). As for the aspect in terms of line width correction or the addition of sub-resolution patterns, proper amounts of line width correction or proper sub-resolution patterns are determined experimentally or by means of simulation for various target patterns taking into account their adjacent layouts, and the results are stored, as optical proximity effect correction parameters, in a table.

The scanning data, which has been corrected in terms of the optical proximity effects and stored in the data storage means 33, is read by the output control means 35 according to predefined timing, and is sent sequentially to the high-speed beam blanking unit 37 via the bit sequencer 36 while controlling the data format. Thus, a mask pattern is written by a raster-scanned electron beam which is controlled by the beam blanker 16 in response to the output signal of the high-speed beam blanking unit 37.

The correction according to the rule-based correction method can be completed in 1.45 sec for the data stored in the data storage means 33 having the capacity of 256-Mbits. On the other hand, the length of time required to write (expose) 256-Mbit scanning data is given by:

$$\{1/(160\times10^6) \text{ (sec/pixel)}\} \times 256\times10^6 \text{ (pixels)} = 1.6 \text{ sec}$$

Since the writing time required for 256-Mbit scanning data is longer than the correction time according to the rule-based correction method, writing operation can be performed continuously by alternately accessing two 256-Mbit raster memories.

The photomask obtained via the above-described process has a pattern accuracy as good as within ±0.03 μm relative to the ideal pattern size which should be obtained after the optical proximity effect correction for pattern areas of the photomask corrected in terms of the optical proximity effects (areas having additional modification patterns). A 0.7 μm excimer laser resist (WKR-PT2, available from Wakojunyaku) was coated on a wafer and exposed to the light emitted by a KrF excimer laser serving as an exposure light source via the photomask produced by the process described above using a step-and-repeat exposure apparatus with NA=0.57 and σ=0.5. After the exposure process, the resist was developed. The developed pattern was evaluated in terms of pattern accuracy. The width of the polysilicon gate pattern whose design width was 0.28 μm was measured for nine different locations in a 22 mm×22 mm exposure field, that is, a center in the field, four corners, and middle points of four sides. The evaluated pattern accuracy was ±0.02 μm. The evaluated depth of focus in the exposure process was ±0.5 μm which was good enough to satisfy the practical process requirements. In the case of an ASIC device based on a 0.25 μm design rule, the process requires for example 0.28±0.028 μm in pattern size and ±0.45 μm in the depth of focus.

When the optical proximity correction for the generated scanning data is not performed, the scanning data in the form of raster data is directly transmitted to the high-speed beam blanking unit 37 from the data storage means 33 via the output control means 35 and the bit sequencer 36.

COMPARATIVE EXAMPLE 1

A photomask was produced in the same manner as Embodiment 1 except that no optical proximity correction was performed. Using this photomask exposure and development were performed in the same manner as Embodiment 1 thereby forming a resist pattern. The width of the resultant pattern was 0.19 μm which had a great deviation from the design value and thus did not satisfy the process requirement. In this case, it was impossible to evaluate the depth of focus.

EMBODIMENT 2

Figure 2:
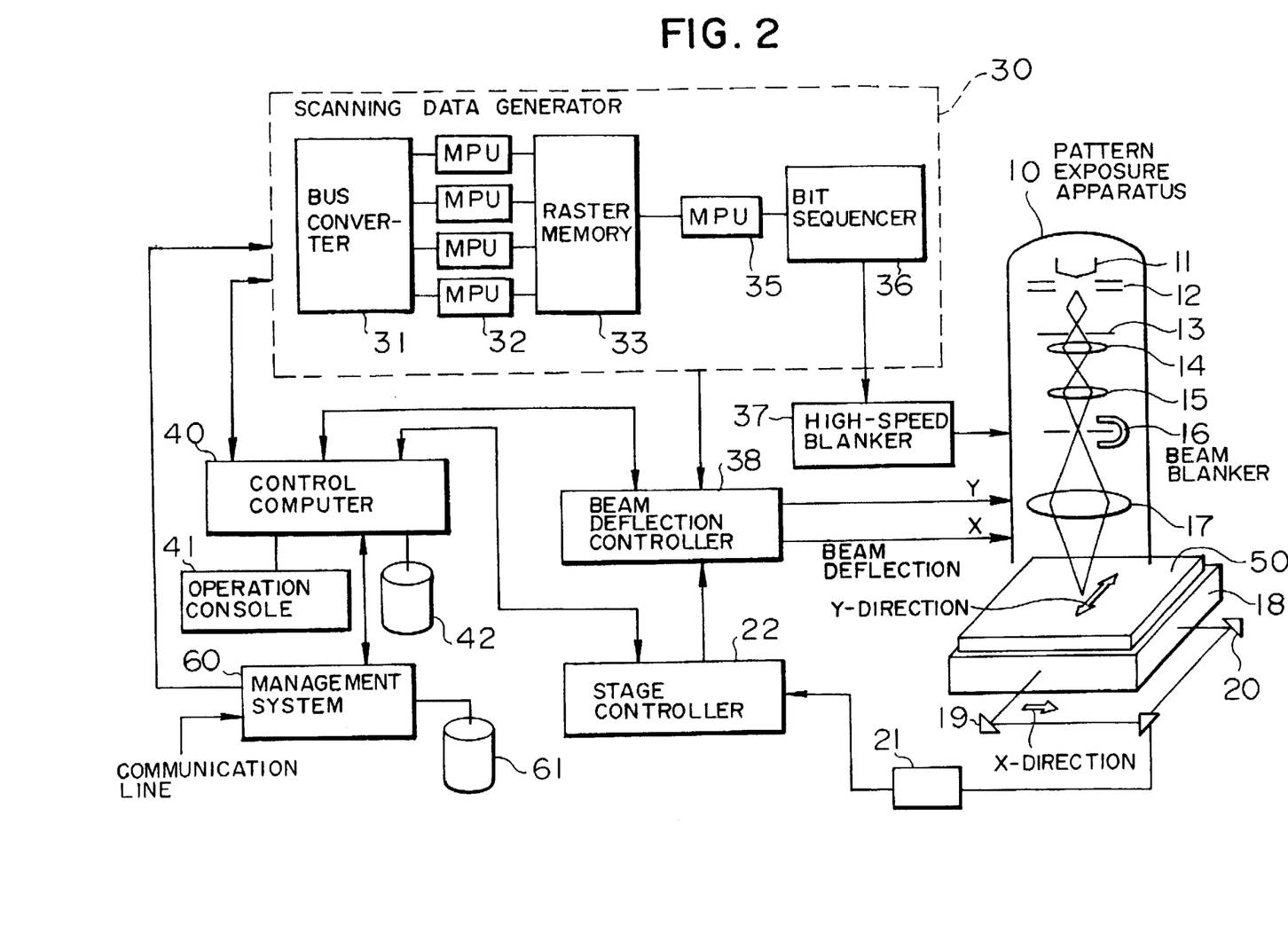
FIG. 2 is a schematic diagram partially in block form illustrating a second embodiment of a photomask production system according to the present invention.

In this embodiment 2, the generated scanning data was corrected according to the function-based correction method. FIG. 2 schematically illustrates a photomask production system employed in this embodiment 2. A difference of the photomask production system shown in FIG. 2 from that of FIG. 1 is that both the scanning data generation means 32 and the correction processing means 34 are constituted by the same set of MPUs (four MPUs). Furthermore, in Embodiment 2, mask data is stored in an external storage device connected to the photomask production system. The other elements are similar to those of the photomask production system of Embodiment 1 and these are not described here in further detail.

The mask data stored in the external storage device is transmitted to a mask data management system 60 via a communication line and stored in a mask data storage disk 61. When an operator desires to start an exposure operation, the operator issues a start command via the operation console 41 to the control computer 40. If it is desired to perform correction for the optical proximity effects on the generated scanning data, at the start of the exposure operation the operator also issues a command via the operation console 41 so as to indicate that the optical proximity effect correction should be performed. The control computer 40 issues a mask data transfer instruction to the mask data management system 60. In response to the mask data transfer instruction, desired mask data is read sequentially from the mask data storage disk 61 and transmitted to the scanning data generator 30.

In the scanning data generator 30, the mask data is distributed, in the order of exposing, to four MPUs constituting the scanning data generation means 32 via the bus converter 31. As in Embodiment 1, the mask data is converted by the scanning data generation means 32 into scanning data in the form of bit-mapped raster data using a known technique. As described above, the scanning data generation means 32 receives mask data from the outside (more specifically, from the disk storage unit 42 via the control computer 40), and generates raster data to be used as scanning data from the received mask data.

The scanning data generated by the scanning data generation means 32 is stored sequentially into the data storage means 33 which consists of, also in this specific embodiment 2, two random access memories each having a capacity of 256 Mbits serving as raster memories.

When the data storage means 33 is entirely filled with the scanning data, the scanning data generation means 32 stops generation of scanning data. The correction processing means 34 (composed of the same set of MPUs constituting the scanning data generation means 32) sequentially reads the scanning data from the data storage means 33. Then the correction processing means 34 selects, via the control computer 40, proper optical proximity effect correction parameters from the optical proximity effect correction parameters stored in the disk storage unit 42, and performs optical proximity effect correction for each of all the scanning data (bit-mapped raster data) according to the function-based correction method. After completion of the optical proximity effect correction, the corrected scanning data is stored again in the data storage means 33.

A specific example of implementation of the function-based correction method is a program Proxima developed by Precim (a USA company). The intensity of exposure light at a certain point of a resist is determined not only by the intensity of exposure light which directly illuminates that point but also affected by the intensity of exposure light illuminating an area adjacent to that point. In the function-based correction technique, the relationship between the intensity of light $Z(x_o, y_o)$ taking into account the light illuminating an area adjacent to a point of interest and the resist pattern design data $D(x_o, y_o)$ (which defines light transmitting areas and light blocking areas) is expressed by an approximation function F as described below:

$$Z(x_o, y_o) = F(D(x_o, y_o))$$

The approximation function F is determined experimentally or by means of simulation in advance. A solution of simultaneous equations which makes $Z(x_o, y_o)$ constant along the edge of a resist pattern to be corrected in terms of the optical proximity effects is determined. The solution of the simultaneous equations can be obtained by calculating the associated inverse matrix. By performing the above calculation, it is possible to determine the edge shape of the mask pattern which results in a constant value of $Z(x_o, y_o)$ at the edge of the resist pattern to be corrected in terms of the optical proximity effects. Then data processing is performed on the scanning data stored in the data storage means 33 so that the resultant scanning data represents the mask pattern determined in the above-described process. Some examples of approximation functions are shown below, wherein which of approximation functions should be used depends on the target pattern and its adjacent layout.

$$Z(x_o, y_o) = \iint \frac{\sin(2\pi k(x-x_o)) \cdot \sin(2\pi k(y-y_o))}{4\pi^2 k^2 (x-x_o)(y-y_o)} \times D(x-x_o, y-y_o) dx dy \quad (1)$$

$$Z(x_o, y_o) = \iint \frac{\sin(2\pi k(x-x_o)) \cdot \sin(2\pi k(y-y_o))}{4\pi^2 k^2 (x-x_o)(y-y_o)} \times \quad (2)$$

$$\exp\left(\frac{-(x-x_o)^2-(y-y_o)^2}{\alpha^2}\right) \times D(x-x_o, y-y_o) dx dy$$

$$Z(x_o, y_o) = \iint \left\{ A\exp\left\{-\left(\frac{x-x_o}{\alpha}\right)^2\right\} + \quad (3)\right.$$

$$\left. B\exp\left\{-\left(\frac{y-y_o}{\beta}\right)^2\right\}\right\} \times D(x-x_o, y-y_o) dx dy$$

where k, A, B, α, and β are constants.

In this technique, when mask data is given, the relationship between a target pattern and its adjacent layout is evaluated, and an optimum approximation function is selected on the basis of the above evaluation result. Using the selected approximation function, the correction processing means 34 performs optical proximity effect correction for each of all the scanning data (bit-mapped raster data). As for the aspect in terms of line width correction or the addition of sub-resolution patterns, proper amounts of line width correction or proper sub-resolution patterns which should be added are determined experimentally or by means of simulation for various target patterns, and the corresponding approximation functions are determined.

The scanning data, which has been corrected in terms of the optical proximity effects and stored in the data storage means 33, is read by the output control means 35 according to predefined timing, and is sent sequentially to the high-speed beam blanking unit 37 via the bit sequencer 36. Thus, a mask pattern is written by a raster-scanned electron beam under the control of the beam blanker 16 in response to the output signal of the high-speed beam blanking unit 37.

The correction processing time and the exposure processing time required in this function-based correction method are shown in Table 2 for various amounts of data (in units of bits) stored in one raster memory with a capacity of 256 Mbits which are subjected to correction process at a time.

TABLE 2

| Amount of data processed at a time | correction processing time | exposure processing time |
|---|---|---|
| 256 Mbits | 37.8 sec | 1.6 sec |
| 64 Mbits | 2.36 sec | 0.4 sec |
| 16 Mbits | 0.15 sec | 0.1 sec |
| 4 Mbits | 0.01 sec | 0.25 sec |
| 1 Mbits | 0.0006 sec | 0.0062 sec |

As can be seen from Table 2, if the amount of data subjected to the correction processing and exposure processing at a time is set to 4 Mbits, then it is possible to perform a mask pattern exposure process to form a mask pattern corrected in terms of the optical proximity effects at the same rate as in the case where no such correction is made, without having any delay due to the correction process in terms of the optical proximity effects.

A 0.7 µm excimer laser resist (WKR-PT2, available from Wakojunyaku) was coated on a wafer and exposed to the excimer laser in a similar manner to Embodiment 1. After the exposure process, the resist was developed. The developed pattern was evaluated in terms of pattern accuracy. The width of the polysilicon gate pattern whose design width was 0.28 µm was measured for nine different locations in a 22 mm×22 mm exposure field. The measured pattern accuracy was ±0.017 µm. The above result indicates that the photomask produced in Embodiment 2 has higher performance than that produced in Embodiment 1. This means that the function-based correction method gives higher correction accuracy than the rule-based correction method. The evaluated depth of focus in the exposure process was ±0.5 µm.

Although the present invention has been described above with reference to specific embodiments, it should be understood that the invention is not limited to those embodiments. For example, a photolithography simulation correction method may also be employed as the correction method. A specific example of the photolithography simulation correction method is a program OPTIMASK or ODE based on the photolithography simulator FAIM developed by Vector Technologies (a USA company). In the photolithography simulation correction method, the photolithography process is simulated taking into account the process parameters or factors including the exposure light intensity, defocus in a resist film, reflection of the exposure light by the resist, and development conditions. The simulation is performed repeatedly until the light intensity distribution across the resist which can create a resist pattern equal to the designed pattern is determined.

Furthermore, although the electron beam pattern exposure apparatus was employed as the pattern exposure apparatus in the specific embodiments described above, other types of pattern exposure apparatus, for example, a pattern exposure apparatus using a 365 nm Ar laser or 325 nm HeCd laser may also be employed. Furthermore, the types of the pattern exposure apparatus which can be employed in the present invention include a raster scan gaussian beam/step-and-repeat stage type, a vector scan gaussian beam/step-and-repeat stage type, a raster scan variable-shape beam/continuously-driven stage type, a raster scan variable-shape beam/step-and-repeat stage type, and a vector scan variable-shape beam/step-and-repeat stage type. In any scanning technique, the photomask production system is provided with data storage means such as a filed memory or raster memory for storing scanning data according to which the exposing beam is turned on/off and deflected. As described above, the correction processing means corrects the scanning data stored in the data storage means according to the predefined correction method.

Furthermore, the present invention can be applied to production of wide variety of devices such as memory ICs, microprocessor units, microcomputer units (CPUs), logic Ics, charge-coupled devices (CCDs), etc.

In the present invention, as described above, it is possible to produce a mask pattern corrected in terms of the optical proximity effects within the same length of time as that required to produce a mask pattern which is not corrected in terms of the optical proximity effects. Furthermore, since the data processing associated with the optical proximity effect correction is performed within the photomask production system, the rounding errors of data which occur during the calculation associated with the optical proximity effect correction and also during the data conversion can be minimized. This makes it possible to produce a high-accuracy mask pattern corrected in terms of the optical proximity effects.

Furthermore, the device design, LSI design data, and mask data which are the same as those employed in conventional technique may be employed in the present invention. Therefore, the present invention can be practiced without having to change the device design environment, LSI design data processing environment, and mask data generation environment. Furthermore, the optical proximity effect correction can be performed without having to make an investment in an additional apparatus (such as an additional engineering work station). This allows a reduction in the cost of apparatus and thus a reduction in production cost. Still furthermore, since the same device design, LSI design data, and mask data can be employed regardless of whether the correction for the optical proximity effects is performed, it is possible to easily perform data processing associated with the correction in terms of the optical proximity effects in a short time even when the resist exposure conditions are changed or the design rule is reduced.

What is claimed is:

1. An apparatus for generating scanning data used to produce a photomask by means of scanning an energy radiation beam, said apparatus comprising:

scanning data generation means which includes a plurality of scanning microprocessor units which receive mask data associated with said photomask and which generate scanning data in the form of bit-mapped raster data to be used in connection with the scanning of said energy radiation beam;

data storage means including random access memory for storing the scanning data generated by said scanning data generation means;

correction processing means which includes a plurality of correction microprocessor units for performing optical proximity effect correction on the scanning data and for re-storing corrected scanning data in the data storage means; and output control means for reading the corrected scanning data according to predefined timing and for sequentially transmitting the corrected scanning data to a pattern exposure apparatus;

wherein said correction refers to such a correction which is made on a pattern formed on the photomask so as to obtain a desired resist pattern, and said resist pattern refers to such a pattern which is formed in a resist by exposing said resist to exposure light via said photomask thereby transferring the pattern formed on the photomask to said resist and then developing said resist.

2. An apparatus for generating scanning data, according to claim 1, wherein the plurality of scanning microprocessor units and the plurality of correction microprocessor units are adapted to perform parallel processing.

3. A method of generating scanning data used to produce a photomask by means of scanning an energy radiation beam, said method comprising the steps of:

generating scanning data in the form of bit-mapped raster data on the basis of mask data associated with said photomask;

storing said scanning data in a memory;

correcting said scanning data by performing optical proximity effect correction for the scanning data according to a predefined correction method;

re-storing corrected scanning data in said memory;

reading said corrected scanning data according to predefined timing; and sequentially transmitting said corrected scanning data to a pattern exposure apparatus;

wherein said correction refers to such a correction which is made on a pattern formed on the photomask so as to obtain a desired resist pattern, and said resist pattern refers to such a pattern which is formed in a resist by exposing said resist to exposure light via said photomask thereby transferring the pattern formed on the photomask to said resist and then developing said resist.

4. A method of generating scanning data, according to claim 3, wherein said step of generating scanning data and said step of correcting said scanning data are performed by means of parallel processing.

5. A method of generating scanning data, according to claim 4, wherein said predefined correction method employed in said step of correcting said scanning data is a rule-based correction method.

6. A method of generating scanning data, according to claim 4, wherein said predefined correction method employed in said step of correcting said scanning data is a function-based correction method.

7. A method of generating scanning data, according to claim 4, wherein said predefined correction method employed in said step of correcting said scanning data is a photolithography simulation correction method.

8. A method of generating scanning data, according to claim 3, wherein said predefined correction method employed in said step of correcting said scanning data is a rule-based correction method.

9. A method of generating scanning data, according to claim 3, wherein said predefined correction method employed in said step of correcting said scanning data is a function-based correction method.

10. A method of generating scanning data, according to claim 3, wherein said predefined correction method employed in said step of correcting said scanning data is a photolithography simulation correction method.

11. A method of producing a photomask comprising the steps of:

generating scanning data in the form of bit-mapped raster data on the basis of mask data associated with said photomask;

storing said scanning data in a memory;

correcting said scanning data in parallel by performing optical proximity effect correction for said scanning data wherein said correction is made in terms of the photolithography effects;

re-storing corrected scanning data in said memory;

reading said corrected scanning data according to predefined timing; and sequentially transmitting said corrected scanning data to a pattern exposure apparatus;

scanning a resist formed on a photomask substrate by an energy radiation beam according to the corrected scanning data thereby writing a pattern into said resist;

developing said resist so as to form a resist pattern; and forming a pattern in a light blocking film on said photomask using said resist pattern as a mask.

* * * * *